United States Patent
Rudziak et al.

(10) Patent No.: US 6,699,821 B2
(45) Date of Patent: Mar. 2, 2004

(54) NB₃AL SUPERCONDUCTOR AND METHOD OF MANUFACTURE

(75) Inventors: Mark K. Rudziak, Westminster, MA (US); Leszek R. Motowidlo, Bristol, CT (US); Terence Wong, Cambridge, MA (US)

(73) Assignee: Composite Materials Technology, Inc., Shrewsbury, MA (US)

( * ) Notice: Subject to any disclaimer, the term of this patent is extended or adjusted under 35 U.S.C. 154(b) by 0 days.

(21) Appl. No.: 10/119,353

(22) Filed: Apr. 9, 2002

(65) Prior Publication Data

US 2002/0179184 A1 Dec. 5, 2002

Related U.S. Application Data

(60) Provisional application No. 60/282,532, filed on Apr. 9, 2001.

(51) Int. Cl.⁷ ............................. B22F 3/20; C22C 1/04; C22C 27/00
(52) U.S. Cl. ...................... 505/430; 420/425; 420/901; 419/3; 419/8; 419/41; 419/46
(58) Field of Search ........................... 419/41, 3, 8, 46; 505/430; 420/901, 425

(56) References Cited

U.S. PATENT DOCUMENTS

| | | | | |
|---|---|---|---|---|
| 4,363,675 A | * | 12/1982 | Yoshizaki | 148/11.5 P |
| 4,411,959 A | | 10/1983 | Braginski et al. | 428/558 |
| 4,575,927 A | * | 3/1986 | Braginski et al. | 29/599 |
| 4,863,804 A | * | 9/1989 | Whitlow et al. | 428/555 |
| 4,865,644 A | | 9/1989 | Charles | 75/84.5 |
| 5,006,289 A | * | 4/1991 | Yamamoto et al. | 264/61 |
| 5,338,333 A | | 8/1994 | Uda et al. | 75/352 |
| 5,362,331 A | | 11/1994 | Tada et al. | 148/98 |
| 5,891,585 A | | 4/1999 | Ayai et al. | 428/614 |
| 5,981,444 A | * | 11/1999 | Sawada et al. | 505/433 |

FOREIGN PATENT DOCUMENTS

EP 1 058 321 6/2000 .......... H01L/39/24

OTHER PUBLICATIONS

R. Akihama, R.J. Murphy and S. Foner, "Fabrication of Multifilamentary Nb–Al by a Powder Metallurgy Process", IEEE Trans. Magn., MAG–17, No. 1, pp. 274–277 (1981).

C.L.H. Thieme, S. Pourrahimi, B.B. Schwartz, S. Foner, "Nb–Al Powder Metallurgy Processed Multifilamentary Wire", IEEE Trans, Magn., MAG–21, pp. 756–759 (1985).

R. Flukiger and W. Goldacker, "Physical Metallurgy and Critical Currents in NB3Al Multifilamentary Wires," Proceedings of the 9th International Conference on Magnet Technology, MT–9, pp. 553–556, Ed. by C. Marinucci and P. Weymouth, Swiss Institute for for Nuclear Research, Zurich, Switzerland (1986).

T. Takeuchi, "Topical Review: NB3Al Conductors for High–Field Applications", Supercond. Sci. Technol., vol. 13. pp. R101–R119, IOP Publishing, UK (2000).

R. Bormann, H. U. Krebs, and A. D. Kent, "The Formation of the Metastable Phase Nb3Al by a Solid State Reaction," Adv. in Cryo. Eng., vol. 32, pp. 1041–1047, ed. by R. P. Reed and A. F. Clark, Plenum Press, New York, (1986).

F. Buta, M.D. Sumption, M. Tomsic, and E. W. Collings, "Progress in the Pilot–Scale Production of High–Temperature Processed Nb3Al Strand", Adv. In Cryo. Eng., vol. 46, pp. 1011–1018, ed. by U. B. Balachandran, D. U. Gubser, K. T. Hartwig, and V. A. Bardos, Kluwer Academic/Plenum Publishers, New York (2000).

C. Suryanarayana, D. Mukhopadhyay, S. N. Patankar, and F. H. Froes, "Grain Size Effects in Nanocrystalline Materials", J. Mater. Res., vol. 7, No. 8 pp. 2114–2118 (1992).

C.A.M. van Beijnen and J.D. Elen, "Multifilament Nb3Sn Superconductors Produced by the E. C. N. Technique", IEEE Trans. on Magn., MAG–15(1), pp. 87–90 (1979).

L. L. Shaw , "Processing Nanostructured Materials: An Overview", JOM, pp. 41–45, Dec. (2000).

* cited by examiner

Primary Examiner—Daniel J. Jenkins
(74) Attorney, Agent, or Firm—Hayes Soloway, P.C.

(57) ABSTRACT

A Nb₃Al superconducting wire and method for fabricating the same wherein Nb and Al powders in combination, or Nb—Al alloy powders are encapsulated in a metal tube, preferably copper or copper-alloy (e.g., CuNi), and the resultant composite is processed by conventional means to fine wire. Multifilamentary composites are produced by rebundling of the powder-filled wires into metal tubes followed by conventional processing to wire of a desired size. It is required for the use of Nb and Al powders in combination that the Nb and Al powder particle size be less than 100 nm. In the use of Nb—Al alloy powders, it is preferred, but not required, that the powder particle size be similarly of a nanometer scale. The use of nanometer-scale powders is beneficial to wire fabrication, allowing the production of long wire piece-lengths. At final wire size, the wires produced by practice of the present invention are heat treated at temperatures below the melting point of copper (1083° C.), with the heat treatment causing conversion of the powder cores or filaments to the A15 superconductor Nb₃Al. The resulting superconducting wires display critical superconducting properties previously achievable only by methods employing temperatures well in excess of the melting point of copper.

30 Claims, No Drawings

NB₃AL SUPERCONDUCTOR AND METHOD OF MANUFACTURE

CROSS-REFERENCE TO RELATED APPLICATION

The present Application claims priority from U.S. Provisional Application No. 60/282,532 filed Apr. 9, 2001.

BACKGROUND OF THE INVENTION

1. Field of the Invention

This invention relates to electrically stable $Nb_3Al$ superconducting wires capable of supporting high critical current densities in applied magnetic fields above 10 Teslas at liquid helium temperature and methods for making the same.

2. Description of the Prior Art

The use of powder metallurgical techniques for the fabrication of $Nb_3Al$ superconducting wires and tapes is well known in the art and is documented in the technical literature. Examples include Akihama et al. [1], Thieme et al. [2], and Flukiger et al [3]. Powder metallurgical processes are only one of several techniques that have been developed in the art for $Nb_3Al$ superconducting wire and tape fabrication. Other processes include jelly-roll, rod-in-tube, and clad chip extrusion [4]. The aim of all these processes is to create a composite containing a fine structure of Nb and Al laminates. A reaction heat treatment is then applied to promote the formation of $Nb_3Al$. In all cases, it has been found that the critical current density ($J_c$) performance of these composites improves as the laminate size is reduced. Bormann et al. performed thin film experiments and found that optimum performance is to be achieved in these materials when the Nb thickness is less than 30 nm and the Al is in stoichiometric ratio (thickness of 9.2 nm for 30 nm Nb) [5]. Greater laminate thicknesses led to the formation of an inhomogeneous A15 phase and also to the formation of non-superconducting phases.

For conventional Nb—Al conductors, the reaction temperature is moderate—typically 800° C. Recently, it has been found that substantial enhancement in high field performance can be realized if much higher temperatures (>1950° C.) are employed. But, whereas the moderate temperature heat treatments are applied for times on the scale of hours, the high temperatures are applied for only seconds or even a fraction of a second. To control the time at temperature and to freeze the high temperature reaction product, the hot composite wire or tape is quenched in a bath of a low melting-point metal such as Ga. In order to obtain the desired A15 $Nb_3Al$, the wire or tape is then heat treated at moderate temperature much as for conventional Nb—Al conductors. This process is referred to as "melt-quench/ordering heat treatment", or more conveniently by its acronym "MQ-OHT".

Melt-quenching of composites containing fine laminates of Nb and Al results in the formation of a supersaturated solid solution Nb—Al bcc phase. The ordering heat treatment (typically, 800° C. for 10 hours) then transforms the supersaturated bcc phase into fine grained, highly homogeneous A15 superconductor $Nb_3Al$. Experiments involving MQ-OHT processing of Nb—Al composite wire are described in Buta et al [6]. EP1058321A2 is an example from the patent literature disclosing MQ-OHT processing of composites containing Nb and Al-alloy laminates.

Although MQ-OHT processed $Nb_3Al$ conductors presently display the best performance at high field, there are drawbacks to this approach. First, thick Nb sheaths are required in order to prevent wire-bursting due to pressures induced by the molten Al during melt-quenching. Such a sheath is wasteful in that it is ineffective as an electrical stabilizer and it contributes nothing to $J_c$, reducing the overall current density capacity of the conductor, known as engineering current density, $J_e$. Second, the temperatures involved in MQ-OHT are so high that copper cannot be used in any conventional way to stabilize the conductor, because the copper would simply melt. Since electrical stabilization is necessary for practical conductors, alternate means of applying the stabilizer, such as electro-plating must be employed, adding complexity and cost to the conductor fabrication process.

As for conventional Nb—Al conductors, it has been found that the performance of MQ-OHT conductors improves as laminate size is decreased. The dilemma for both approaches is that it is exceedingly difficult to produce practical lengths of multifilamentary conductor having the desired laminate sizes of less than 100 nm. For all fabrication routes, wire breakage becomes severe as this size range is approached. The primary cause is thought to be rapid hardening of the Nb—Al elements as a result of extensive cold-work and fine-scale inter-mixing of the Nb and Al. As the filament hardness increases, it eventually reaches a point where the other composite elements can no longer provide mechanical support, and the composite fails. The present invention discloses methods by which to circumvent this hardening problem for the production of high performance $Nb_3Al$ superconducting wire. The invention also permits the use of heat treatment temperatures below the melting point of copper while still achieving performance levels presently attainable only by higher temperature MQ-OHT processes.

In one embodiment of the invention, Nb and Al powders are mixed in stoichiometric ratio for $Nb_3Al$, this powder mix is encapsulated in a copper or copper alloy tube, and the resulting composite is brought to multifilamentary wire by means of conventional wire processing and rebundling steps. The Nb and Al powders are characterized by a nanometer-scale particle size (<100 nm). Of relevance to this processing method is the analysis of Suryanarayana et al. [7] in which it is argued that a critical grain size exists for nanocrystalline materials below which Hall-Petch hardening is violated. Below this size, the bulk material begins to soften with decreasing grain size rather than harden.

In another embodiment of the invention, Nb—Al alloy powders are used in place of pure Nb and Al. These powders are preferably also nanometer in scale. The Nb—Al alloy consists of the supersaturated bcc phase characteristic of the MQ-OHT process. This phase is known to have only limited ductility. Of relevance to this processing method is the work of van Beijnen and Elen [8] on the fabrication of multifilamentary $Nb_3Sn$ superconducting wires by the powder-in-tube method. In this process, a powder precursor compound ($NbSn_2$) is reacted with Nb in the encapsulating tube wall to produce superconducting $Nb_3Sn$. The present invention is distinct from this prior art in that reaction of the powder cores or filaments with an adjacent material is unnecessary and, in fact, undesirable.

U.S. Pat. No. 4,411,959 and U.S. Pat. No. 4,575,927 disclose superconducting wires containing sub-micron powders of brittle superconducting materials and methods for making the same. The present invention is distinct from this prior art in that the Nb—Al alloy powders used are not themselves superconducting.

The nanometer-scale powders used in the practice of the invention may be fabricated by any of a number of available methods, including spark erosion, gas condensation, and electrodeposition. Several of these processes are discussed in an overview by Shaw [9].

SUMMARY OF THE INVENTION

It is an object of the present invention to provide methods by which to circumvent the core or filament hardness problems associated with breakage in the fabrication of $Nb_3Al$ superconducting wires. It is a further object of the invention to produce $Nb_3Al$ superconducting wire characterized by full electrical stabilization and high performance at high applied magnetic fields (>10 T).

The present invention utilizes powder metallurgical techniques in the fabrication of the $Nb_3Al$ superconducting wire. These include the steps of encapsulating powders in a ductile metal tube and processing the resultant composite to wire by means well known in the art, such as wire drawing. Multifilamentary composites are fabricated by way of rebundling single-core wires into metal tubes and processing the resultant multifilamentary composite to wire, as is also well known in the art.

Specifically, two methods are disclosed for the fabrication of $Nb_3Al$ superconducting wire. These methods may be summarized as follows:

1) Nb powders and Al powders are mixed in a stoichiometric ratio for $Nb_3Al$ (i.e., 3:1 atomic ratio). The powders are characterized by a particle size of less than 100 nm. These powders are encapsulated in a ductile metal tube, preferably copper or copper-alloy, and the resultant composite is reduced to wire by conventional means. The wire is subjected to a reaction heat treatment at temperatures below the melting point of copper (1083° C.) for sufficient time to form the $Nb_3Al$ superconducting compound in the powder core or filaments.

2) Nb—Al alloy powder is encapsulated in a ductile metal tube, preferably copper or copper-alloy, and the resultant composite is reduced to wire by conventional means. The Nb—Al alloy powder consists of a supersaturated solid solution bcc phase of Nb—Al in which the atomic ratio of Nb-to-Al is 3:1. The powder particle size is preferably less than 100 nm, but larger particle sizes may be employed if so desired. The composite wire is heat treated at temperatures below the melting point of copper (1083° C.) for sufficient time to form the $Nb_3Al$ superconducting compound in the powder core or filaments.

DETAILED DESCRIPTION OF THE INVENTION

In a preferred embodiment of the invention, Nb powders and Al powders are mixed in a stoichiometric ratio for $Nb_3Al$ (i.e., 3:1 atomic ratio). The powders are characterized by a starting particle size of less than about 100 nm typically 50 to 100 nm. The powder particles are preferably spherical in shape to promote efficient, uniform packing density. The Nb and Al powders are mixed inside a vial using a suitable device, such as a Spex mill. To prevent atmospheric contamination, the powders are sealed in the vial under inert gas atmosphere. The mixed powders are poured into a metal tube of predetermined dimensions. In order that the encapsulating tube later provide electrical stability, it is preferably made of copper or a copper alloy such as CuNi, but any ductile metal (e.g., Al-alloy, Ag) may be utilized if so desired. Optionally, the metal tube may be lined with a barrier material such as Nb or Ta. This barrier material will prevent diffusional interactions between the powder core or filaments and the metal tube material during later reaction heat treatments.

The encapsulating metal tube may be filled with the powder mixture in air or, preferably, in an inert gas atmosphere such as argon. The atmosphere in the powder-filled tube may then optionally be evacuated by means of a vacuum pump. The powder-filled tube is then sealed by means such as crimping or welding at the tube ends.

The powder-filled tube is processed to wire by means well known in the art. The methods that may be utilized include, but are not restricted to, conventional extrusion, hydrostatic extrusion, groove-rolling, cassette-die drawing, and wire drawing. Should the application be suitable for a tape conductor, flattening by means of a rolling mill may be appropriate.

For most applications, a multifilamentary wire will be desirable. This may be achieved by bundling sections of the single-core wire at some intermediate stage of wire reduction, encapsulating the bundle in a ductile metal tube, and processing the resultant composite to wire by means similar to those just described for processing the powder-filled metal tube. Depending upon the application, it may be necessary to perform the bundling operation more than once, so that bundled wire is re-bundled one or more times.

It may in some cases be desirable to reduce the void space in single-core or multifilamentary composites prior to processing to wire. This may be accomplished by means such as cold isostatic pressing of the composite. Hot (300° C.) consolidation processes, such as hot isostatic pressing, are to be avoided due to the danger of embrittlement of the composite as a result of premature reaction of the Nb and Al powders. However, hot consolidation processes may be employed when the composite wire is at final size and further wire reduction is unnecessary.

The primary benefit to this embodiment of the invention is that the amount of reduction of the powder elements necessary to achieve Nb and Al laminate thicknesses on the order of 1–10 nm is much smaller than would be possible with conventional powders or foils. For example, a −325 mesh powder, fully densified, would require a reduction in area of $2 \times 10^7$ to reach a laminate thickness of ~10 nm. By contrast, 100 nm powder, fully densified, requires a reduction in area of only $10^2$. Hence, much less cold-work is imparted in the practice of the present invention, so work-hardening is greatly reduced as compared to current practices.

During wire reduction, the nanometer-scale powders used in this embodiment of the invention also quickly reach the critical transition point where Hall-Petch hardening is violated, and softening occurs. This is beneficial for wire piece-length.

At final wire size, where the Nb laminate thickness is 30 nm or less, the Nb—Al composite wire is subjected to a reaction heat treatment at temperatures below the melting point of copper. The reaction heat treatment results in conversion of the powder core or filaments to superconducting $Nb_3Al$. A typical heat treatment would be 800° C. for 10 hours, but the particulars will vary depending upon the laminate size in the conductor; other temperatures, e.g. 600 to 900° C., and/or other times may be desirable. The heat treatment is performed in an inert gas atmosphere or vacuum in order to prevent contamination of the conductor.

In order to improve electrical connection within the powder core or filaments of the conductor, it may be desirable to consolidate the conductor by means such as cold isostatic pressing prior to application of the reaction heat treatment. Alternatively, the reaction is brought about in whole or in part by means of a hot consolidation process such as hot isostatic pressing. If in part, the reaction may be completed by application of a suitable heat treatment after hot consolidation.

In another embodiment of the invention, Nb—Al alloy powder is used in place of the Nb and Al powder mixture described above. The Nb—Al alloy powder consists of a supersaturated solid solution bcc phase. It is preferred, but not required, that the powder particles are less than 100 nm in size and are spherical in shape. The powder is encapsulated and processed exactly as described above. The final heat treatment will also typically be 800° C. for 10 hours. The heat treatment converts the supersaturated bcc phase powder core or filaments to fine-grained, superconducting $Nb_3Al$. As described above, the reaction heat treatment may be applied subsequent to or in concert with a consolidation step such as isostatic pressing.

If Nb—Al alloy powder having a particle size larger than about 100 nm is used, this powder optionally may be mixed with a fine powder such as $Al_2O_3$ to aid in the flow of the powder core. This powder should have a particle size below 100 nm and preferably below 50 nm. The volume fraction of this powder preferably will be less than 10%.

The primary benefit to this embodiment of the invention is that the excellent critical properties achievable by the MQ-OHT process are realized in a fully stabilized conductor. The invention bypasses the melt-quench step that prohibits conventional copper stabilization by utilizing Nb—Al powders consisting of the phase that would be produced by melt-quenching. As a result, only the ordering heat treatment, which is compatible with copper stabilization, need be applied to the final conductor in order to obtain MQ-OHT conductor performance.

Methods for practicing the present invention are described in the following non-limiting examples.

EXAMPLE I

Nb powder and Al powder, each having a maximum particle size of 80 nm, are mixed in a ratio of 10.36:1 by weight. For mixing, the powders are poured into a vial under an argon atmosphere and the cap of the vial is then screwed in place. The vial is placed in a Spex mill, where it is shaken for ten minutes. The vial is returned to the argon atmosphere. It is opened, and the powder mixture is removed.

A clean OFHC copper tube having an external diameter of 6.35 mm and an internal diameter of 4.0 mm is prepared by TIG-welding a copper plug onto one end. The Nb—Al powder mixture is poured into the tube under argon atmosphere. The tube is vibrated at high frequency during filling to ensure uniformity in the powder column. A copper plug is then loosely fitted into the open end of the tube. The powder-filled tube is evacuated at room temperature to a pressure of $10^{-6}$ torr, and the tube end is then sealed by TIG-welding.

The powder-filled tube is drawn at room temperature to 1.25 mm diameter. The powder-filled drawn tube is cropped, then straightened and cut into 7 pieces. These powder-core elements are cleaned by lightly etching in an aqueous nitric acid solution. They are then inserted into a clean OFHC copper tube of the same dimensions as was used for the initial powder composite. Copper plugs are inserted into each end of the tube and this assembly is evacuated at room temperature and sealed.

The multifilamentary composite is drawn at room temperature to a final wire diameter of 0.7 mm. At this wire size, the powder filament diameters are less than 100 microns in size. The wire is reaction heat treated for 10 hours at 800° C. under argon atmosphere to convert the powder filaments to superconducting $Nb_3Al$.

EXAMPLE II

The process described in Example I is repeated, except that the Nb and Al powder mixture is replaced by supersaturated solid solution bcc phase Nb—Al powder. The particle size in the powder is a maximum of 80 nm.

EXAMPLE III

The process described in Example I is repeated, except that the Nb and Al powder mixture is replaced by supersaturated solid solution bcc phase Nb—Al powder. The particle size in the powder is less than 5 microns.

EXAMPLE IV

The process described in Example III is repeated, except that. the Nb—Al alloy powder is mixed with 1% by weight of powdered $Al_2O_3$ to aid in flow of the Nb—Al alloy powder during wire processing. The mixing is performed in the same manner as for the Nb and Al powders in Example I.

The above examples are only intended to be illustrative in nature, not in any way restrictive. Numerous changes may be made in practice of the invention without departing from its scope. For example, Al alloy powders such as AlMg, AlGe or AlSi may be used in place of pure Al powder. In such case, the Nb and Al alloy powders should be mixed in a stoichiometric ratio, based on Nb:Al of $\geq 3:1$. The scope of the invention is to be limited only as set forth in the attached claims.

REFERENCES

[1] R. Akihama, R. J. Murphy and S. Foner, Fabrication of Multifilamentary Nb—Al by a Powder Metallurgy Process", IEEE Trans. Magn., MAG-17, No. 1, 274 (1981).

[2] C. L. H. Thieme, S. Pourrahimi, B. B. Schwartz, S. Foner, "Nb—Al Powder Metallurgy Processed Multifilamentary Wire", IEEE Trans. Magn., MAG-21, 756 (1985).

[3] R. Flukiger and W. Goldacker, "Physical Metallurgy and Critical Currents in $NB_3Al$ Multifilamentary Wires," Proceedings of the $9^{th}$ International Conference on Magnet Technology, MT-9, 553, Ed. by C. Marinucci and P. Weymouth, Swiss Institute for Nuclear Research, Zurich, Switzerland (1986).

[4] T. Takeuchi, "TOPICAL REVIEW: $Nb_3Al$ Conductors for High-Field Applications", Supercond. Sci. Technol., vol. 13. R101, IOP Publishing, UK (2000).

[5] R. Bormann, H. U. Krebs, and A. D. Kent, "The Formation of the Metastable Phase $Nb_3Al$ by a Solid State Reaction," Adv. in Cryo. Eng., Vol. 32, 1041, ed. by R. P. Reed and A. F. Clark, Plenum Press, New York, (1986).

[6] F. Buta, M. D. Sumption, M. Tomsic, and E. W. Collings, "Progress in the Pilot-Scale Production of High-Temperature Processed $Nb_3Al$ Strand", Adv. In Cryo. Eng., vol. 46, 1011, ed. by U. B. Balachandran, D. U. Gubser, K. T. Hartwig, and V. A. Bardos, Kluwer Academic/Plenum Publishers, New York (2000).

[7] C. Suryanarayana, D. Mukhopadhyay, S. N. Patankar, and F. H. Froes, "Grain Size Effects in Nanocrystalline Materials", J. Mater. Res., Vol. 7, No. 8, 2114 (1992).

[8] C. A. M. van Beijnen and J. D. Elen, "Multifilament Nb$_3$Sn Superconductors Produced by the E. C. N. Technique", IEEE Trans. on Magn., MAG-15(1), 87 (1979).

[9] L. L. Shaw, "Processing Nanostructured Materials: An Overview", JOM, 41, December (2000).

We claim:

1. A process for manufacturing an Nb$_3$Al superconductor comprising the steps of encapsulating a niobium powder and an aluminum powder having a maximum particle size of less than about 100 nm in a billet formed of a ductile metal, working the billet through a series of reduction steps, and heat treating the reduced billet at a temperature below the melting point of Cu and time sufficient to form superconducting Nb$_3$Al.

2. The process of claim 1, wherein the niobium and aluminum powders are provided in a stoichiometric ratio for Nb$_3$Al.

3. The process of claim 1, wherein the niobium and aluminum powders have a maximum particle size in the range of 50–100 nm.

4. The process of claim 1, wherein the niobium and aluminum powder particles are spherical in shape.

5. The process of claim 1, wherein the billet comprises a copper or copper-alloy metal tube.

6. The process of claim 1, and including the step of bundling a plurality of said reduced billets, encapsulating the reduced billets in a ductile metal tube, and further reducing the bundled billets.

7. The process of claim 1, and including the step of packing the niobium and aluminum powders in the billet prior to processing.

8. The process of claim 1, wherein the niobium and aluminum powders are packed by cold isostatic pressing.

9. The process of claim 1, wherein the niobium and aluminum powders are compacted by vibration.

10. The process of claim 1, wherein the reduced billet is heat treated for 10 hours at 800° C.

11. The process of claim 1, wherein the billet is formed of CuNi.

12. The process of claim 1, wherein the aluminum powder comprises a powdered alum alloy.

13. The process of claim 12, wherein the powdered aluminum alloy comprises powdeyed AlMg, AlGe or AlSi.

14. The process of claim 1, and including the step of adding powdered Al$_2$O$_3$ to aid in the flow during processing.

15. Nb$_3$Al superconductor made according to the process of claim 1.

16. A process for manufacturing an Nb$_3$Al superconductor comprising the steps of encapsulating a niobium-aluminum powder having a maximum particle size of less than about 100 nm in a billet formed of a ductile metal, working the billet through a series of reduction steps, and heat treating the reduced billet at a temperature below the melting point of Cu and time sufficient to form superconducting Nb$_3$Al.

17. The process of claim 16, wherein the niobium-aluminum powder has a stoichiometric ratio for Nb$_3$Al.

18. The process of claim 16, wherein the niobium-aluminum powder has a maximum particle size in the range of 50–100 nm.

19. The process of claim 16, wherein the niobium-aluminum powder particles are spherical in shape.

20. The process of claim 16, wherein the billet comprises a copper or copper-alloy metal tube.

21. The process of claim 16, and including the step of bundling a plurality of said reduced billets, encapsulating the reduced billets in a ductile metal tube, and further reducing the bundled billets.

22. The process claim 16, and including the step of packing the niobium-aluminum powder in the billet prior to processing.

23. The process of claim 16, wherein the niobium-aluminum powder is packed by cold isostatic pressing.

24. The process of claim 16, wherein the niobium-aluminum powder is compacted by vibration.

25. The process of claim 16, wherein the niobium-aluminum alloy powder consists of a supersaturated solid solution bbc phase of niobium-aluminum.

26. The process of claim 16, wherein the niobium-aluminum alloy powder consists of a supersaturated solid solution bbc phase of niobium-aluminum in which the atomic ratio of niobium-to-aluminum is 3:1.

27. The process of claim 16, wherein the reduced billet is heat treated for 10 hours at 800° C.

28. The process of claim 16, wherein the billet is formed of CuNi.

29. The process of claim 16, and including the step of adding powdered Al$_2$O$_3$ to aid in the flow during processing.

30. Nb$_3$Al superconductor made according to the process of claim 16.

* * * * *